United States Patent [19]

Eibner

[11] 4,442,425
[45] Apr. 10, 1984

[54] PASSIVE FIBER OPTIC KEYBOARD

[75] Inventor: Jules A. Eibner, Maple Glen, Pa.

[73] Assignee: Sperry Corporation, New York, N.Y.

[21] Appl. No.: 321,009

[22] Filed: Nov. 13, 1981

[51] Int. Cl.³ ............................ G06F 3/02; G08C 9/00
[52] U.S. Cl. ............................. 340/365 S; 340/365 R; 340/365 P; 340/365 E; 200/DIG. 47; 250/200; 250/578; 364/713; 400/478
[58] Field of Search ............ 340/365 S, 365 R, 365 P, 340/365 E; 400/477–479.1, 479.2, 480, 491.3; 179/90 K; 178/17 C; 364/713; 200/DIG. 47; 333/29, 138, 141; 250/200, 201, 202, 221, 216, 568, 569, 578

[56] References Cited

U.S. PATENT DOCUMENTS 3,129,395  4/1964  Mason .................................... 333/30
3,750,150  7/1973  Cramer et al. ................... 340/365 P
4,298,861  11/1981  Tellerman ........................... 340/365

OTHER PUBLICATIONS

IBM Technical Disclosure Bulletin, Uberbacher, vol. 17, No. 3, Aug. 1974, "Optical Keyboard".

*Primary Examiner*—Donnie L. Crosland
*Attorney, Agent, or Firm*—J. B. Sowell; T. J. Scott; M. M. Truex

[57] ABSTRACT

An electrically passive keyboard is provided with an array of keys. Each key is provided with an actuating bar which when depressed cooperates with a plurality of coded shutters. Each shutter is arranged to intercept a beam of light passing from light projecting elements to light collecting elements. Light pulses generated at a light source are coupled to the projecting elements with fiber optic cables. Decoding logic is coupled to the light collectors with fiber optic cables. Delay elements are provided in series in the fiber optic cables so that the decoding elements receives a plurality of binary coded light signals in a predetermined timed sequence which are converted into binary coded electrical signals at a point remote from the electrically passive keyboard.

11 Claims, 7 Drawing Figures

PASSIVE FIBER OPTIC KEYBOARD

BACKGROUND OF THE INVENTION

1. Field of the Invention

The present invention is related to keyboard apparatus of the type employed with digital electronic equipment. More particularly, the present invention keyboard is adapted for use in any environment in which static electricity or sparks would present a data error or environmental problem.

2. Description of the Prior Art

Many electro-magnetic devices now in use employ optical sensing devices to detect mechanical motion. Such devices are commonly known and are commercially available as sensing devices and do not require further description herein.

Touching or depressing a key on a prior art electrical keyboard results in a switch effect which either completes an electrical circuit or provides a change which can be sensed by an electrical circuit.

Electrical keyboards may be provided with physical contact electrical switches. Such switches include not only moveable contact pairs, but also include cross-wires and membrane conductive contacts which physically touch to complete an electrical circuit. Switches which sense a change in capacitance and/or a change in resistance have been generally classified with electrical switches. Electrical switches may initiate or cut off the flow of electricity in the circuit being actuated. Electrical switches of all types are subject to creation of data errors when employed in a digital data keyboard because static electricity, which builds up on the human body or equipment, is sufficient to generate a flow of electricity in the sensing circuit of the electrical keyboards.

Magnetic keyboard switches of the type which do not have contact elements, operate on the Hall effect principle or a change of conductive reactance which is great enough to be sensed in an electrical circuit. Magnetic keyboard switches are also subject to errors due to electro-magnetic interference (EMI), including static electricity, which induces the flow of electricity in the sensing circuits.

Presently, keyboards are used in conjunction with medical monitering equipment, thus, extreme care should be taken to avoid all shock hazards which could be caused by ground currents and/or static discharge.

It would be desirable to eliminate the problems associated with electro-magnetic interference associated with keyboards. Not only could the digital data type of errors be eliminated, but completely passive keyboards would be desirable for use in a chemical or gas environment which could be hazardous to humans or destructive to ordinary electrical circuits and electronic components.

SUMMARY OF THE INVENTION

It is a principal object of the present invention to provide the novel electrically passive keyboard.

It is another principal object of the present invention to provide a passive keyboard having its electrical energized light source and its electrical photo diode detectors remote from the keys of the keyboard.

It is another object of the present invention to provide a keyboard which is substantially immune to deterioration by environmental impurities in the atmosphere and does not present a spark hazard in the presence of gases.

It is yet another object of the present invention to provide a keyboard for generating electrical signals which does not require electrical contacts or magnetic sensors.

It is another object of the present invention to provide means for multiplexing coded signals indicative of a plurality of different keys into a single light channel for decoding at a remote location.

It is yet another object of the present invention to provide a novel keyboard having removable keys and removable encoding members which are not sensitive to wear.

According to these and other objects of the present invention there is provided an improved fiber optic keyboard comprising a plurality of movable keys, each of said keys being adapted to move an actuating bar connected thereto. The actuating bars operate as a plurality of coded shutters and each shutter is capable of intercepting a beam of light generated on one side of the shutter by fiber optic projection means and collectable on the opposite side of the shutter by light collectors. Means are provided for generating pulses of light which are coupled to the projection means. Decoding logic means are coupled to the light collectors for detecting the absence or presence of light at the light collectors when the shutters are actuated by depression of a key on the keyboard. The decoding logic means are capable of producing binary coded electrical signals at a remote location which is indicative of the key which has been depressed.

DETAILED DESCRIPTION OF THE PREFERRED EMBODIMENT

Figure 1:
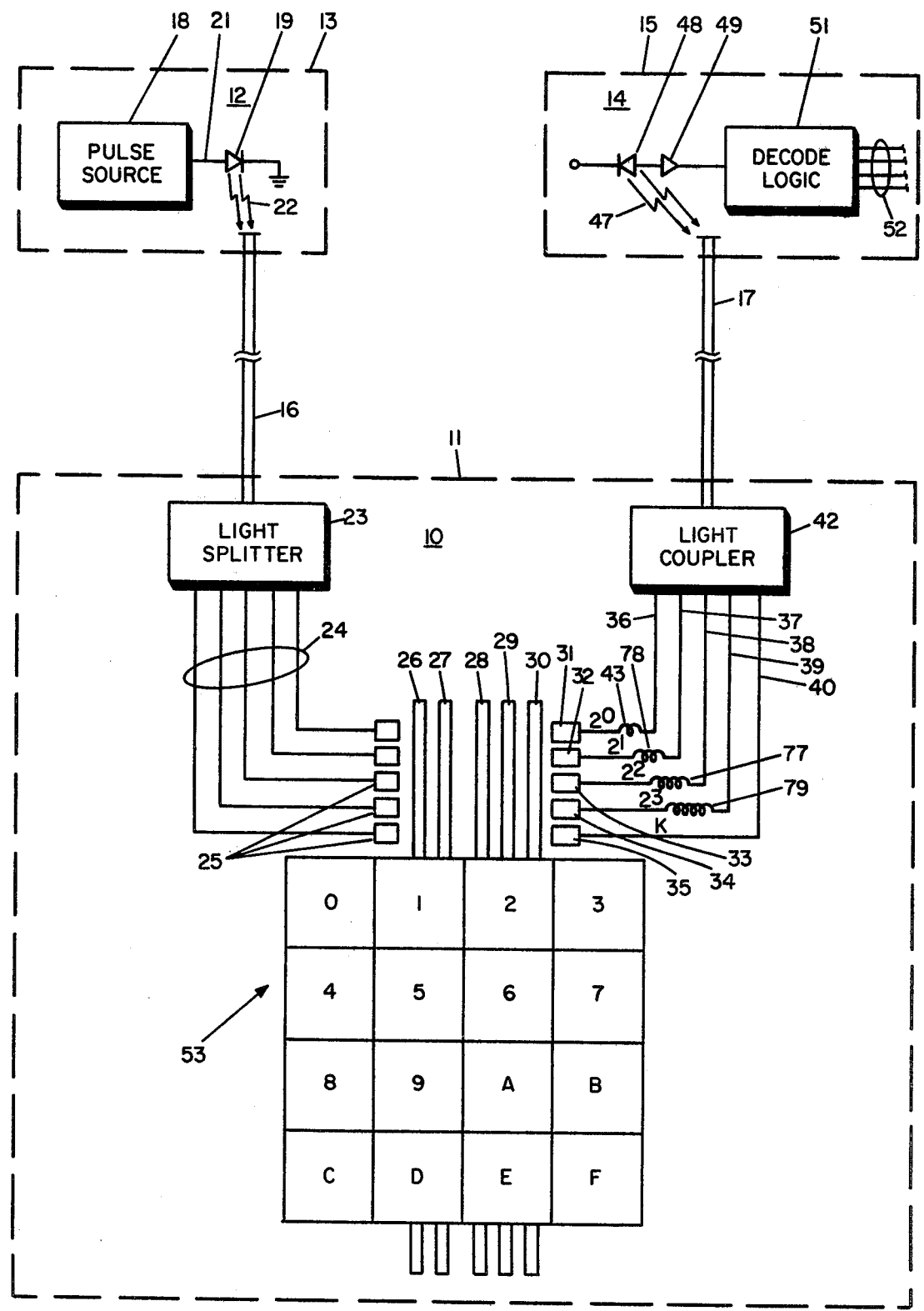
FIG. 1 is a schematic plan view of an electrically inert keyboard for generating light input signals, encoding the light input signals and then decoding the output light signals into electrical signals.

The passive keyboard 10 is shown inside of dash lines 11 which is indicative of its holder or container. The passive keyboard is remotely located from the optical pulse source 12 shown inside of its dash lines 13. The passive keyboard 10 is also remotely located from the optical receiver and decoder 14 shown inside of its dash lines 15. It will be understood that the pulse source 12 and receiver and decoder 14 are electronic elements subject to EMI and are located at a point which is remote from the passive optic keyboard 10. Pulse source 12 and receiver and decoder 14 are preferably located together inside of the enclosure of an associated data processing equipment (not shown) and are connected to the passive keyboard 10 through fiber optic cables 16 and 17 respectively.

Electrical pulse source 18 generates a continuous high speed electrical pulse stream on line 21 which is connected to the light emitting diode 19. The light emitting diode 19 generates a corresponding optical pulse stream shown at point 22 which is coupled to the fiber optic cable 16. Cable 16 carries the optical pulse stream to light splitter 23 which is within the passive keyboard 10. Light splitter 23 divides or splits the optical pulse stream into five substantially equal optical pulse streams which are coupled into fiber optic conductors or cables 24.

The fiber optic conductors or cables 24 are connected to self-focusing lenses 25 which act as light projecting means. The optical pulse streams at self-focusing lenses 25 are projected through the shutters 26 to 30 and are collected by self-focusing lenses 31 to 35. It will be understood that the shutters 26 to 30 may or may not intercept the optical pulse streams being emitted by the five projection means 25. The optical pulse streams which do arrive at the self-focusing lenses 31 to 35 are transmitted via fiber optic conductors 36 to 40 to the light coupler 42. Conductor 36 is shown having the single loop delay 43 which is a schematic representation for delaying the time it takes the optical pulse stream on conductor 36 to reach light coupler 42. In similar manner, the delays 78, 77 and 79 are schematically shown increasing the amount of delay of the optical pulse streams in their associated conductors 37, 38 and 39. No delay is shown in the conductor 40. By providing the different delays in the fiber optic conductors 36 to 40, the optical pulse streams which are appearing simultaneously at the self-focusing lenses 31 to 35 are appearing at the light coupler 42 at different times because of the associated different delays in the conductors 36 to 40. Light coupler 42 recombines the pulse streams that are arriving on conductors 36 to 40 into a single time division multiplexed pulse stream which is coupled to fiber optic cable 17 to provide light emission shown at point 47 adjacent to the photo diode 48. The electrical signals generated by photo diode 48 are amplified by amplifier 49 and decoded in decoding logic 51 to produce binary coded electrical signals on line 52. It will be understood that the binary coded electrical signals on line 52 are of the type that are employed in electronic data processing equipment and do not require further explanation herein.

The sixteen keys 53 shown as 0-9 and A-F keys in FIG. 1 are only indicative of a small set of keys of the keyboard 10. The array of keys could be enlarged to accomodate any reasonable full size keyboard and would only require an increase in the number of shutters, their associated projecting lense and collecting lenses.

Figure 2:
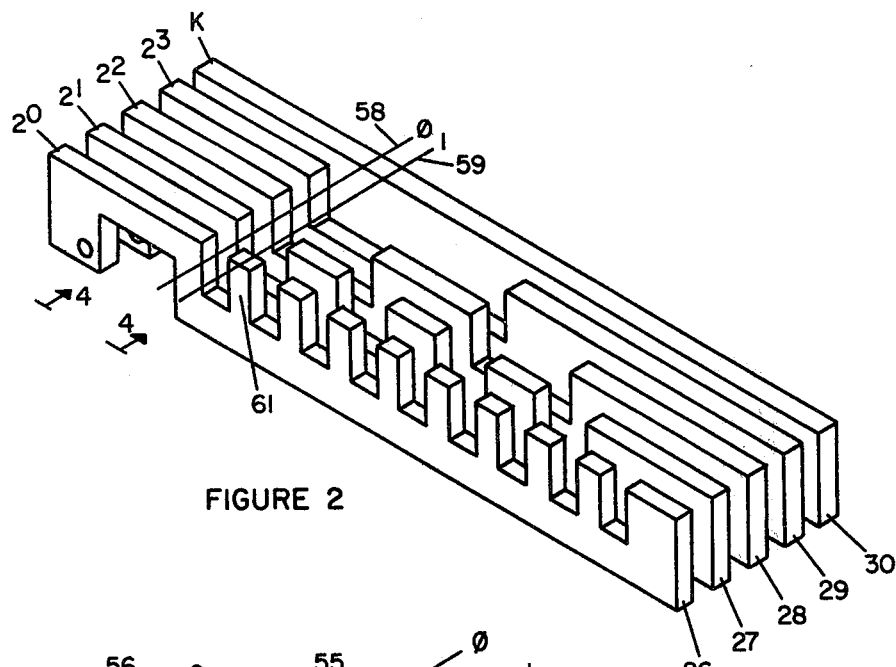
FIG. 2 is an isometric view of a set of preferred embodiment encoding bars and shutters.
Figure 3:
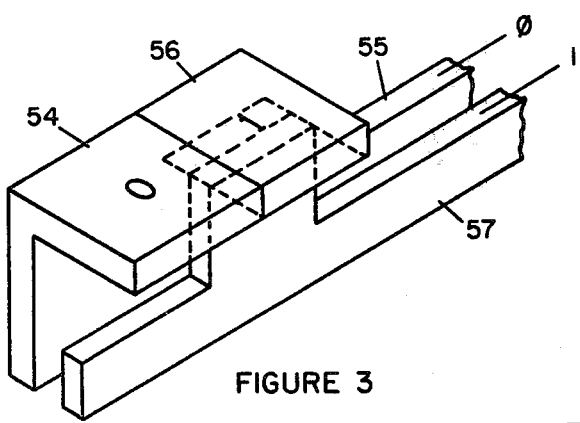
FIG. 3 is an isometric view of a partial set of keys showing attached actuating bars for engaging the encoding bars of FIGS. 1 and 2.
Figure 4:
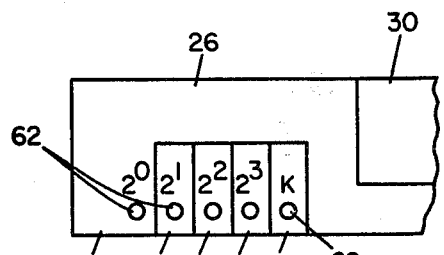
FIG. 4 is a partial side elevation view of the shutter end of the encoding bars taken at lines 4—4 of FIG. 2.

Refer now to FIGS. 2 to 4 showing in greater detail the operation of keys 53 and the associated shutters 26 to 30. The zero key 54 has connected thereto an associated actuating bar 55 and the one key 56 has connected thereto an associated actuating bar 57. When the zero key 54 and its associated actuating bar 55 is depressed, bar 55 fits into the first set of notches or encoded apertures shown at the line 58. Thus, the only shutter bar which is depressed when the zero key 54 is depressed is the K shutter bar 30. When the one key 56 is depressed, its actuating bar 57 moves vertically downward on the line 59 so as to engage the projection 61 on the shutter 26. The actuating bar 57 also engages the K shutter 30.

The apertures and projections on the shutters 26 to 30 are so arranged that they provide a binary coded arrangement of apertures and projections that are engaged by the actuating bars of the keys 53. For example, shutter 26 may be coded as the $2^0$, and shutter 27 may be coded as the $2^1$. Shutters 22 and 29 are coded as the $2^2$ and $2^3$ bars. The K bar is not coded and will always be depressed to enable the decode logic 51 to detect that a key has been depressed as will be explained with regard to FIG. 4.

When the zero key is depressed, only the K shutter 30 is moved vertically downward. When the aperture 62 in the K bar 30 is between the associated projection and collecting lenses 25 and 35 an optical pulse stream is produced on fiber optic conductor 40 to light coupler 42. Since depression of the zero key 54 does not move shutters 26 to 29 downward, the collection lenses 31 to 34 are not receiving the optical pulse streams being generated by their projection lenses 25. The multiplexed signal on fiber optic cable 17 and the electrical signal produced at amplifier 49 are decoded in decoding logic 51 as a zero. In similar manner, when the one key 56 is depressed, shutters 30 and 26 are moved to permit the optical pulse streams being produced by projection lenses 25 to be received by collecting lenses 31 and 35 to produce the optical pulse streams on fiber optic conductors 36 and 40. The two optical pulse streams on fiber optic conductors 36 and 40 are combined and multiplexed into a single optical pulse stream which is produced on fiber optic cable 17. The combined pulse stream is sensed at photodiode 48 and converted into binary coded electrical signals on output lines 52. In similar manner, depression of keys 2-9 and A-F will produce binary coded electrical signals at the output lines 52 indicative of depression of their associated keys.

It will be noted in FIG. 4 that each of the shutters 26 to 30 is provided with an aperture similar to aperture 62. However, the aperture 62 is slightly larger than the apertures in shutters 26 to 29 to assure that the pulses on the K cable 40 will always be present when the optical pulse stream is present on any of the other four fiber optic conductors 36 to 39.

Figure 5:
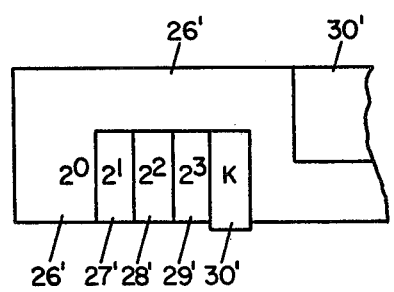
FIG. 5 is a partial side elevation view of a set of modified embodiment shutters similar to FIG. 4.

Refer now to FIG. 5 showing a modified embodiment of the structure shown in FIG. 4. The mode of operation of the FIG. 4 preferred embodiment is to have the optical pulse streams normally intercepted by the shutters 26 to 30. Depression of the keys and actuating bars cause the shutters 26 to 30 to permit the transmission of the optical pulse streams from the projection lenses 25 to the collecting lenses 31 to 35 as the case may be. In the modified embodiment of FIG. 5, the projection lenses 25 are arranged so that their pulse streams are normally projecting under the shutters and are normally received by the collection lenses 31 to 35. In this embodiment, the modified shutters 26' to 30' will intercept the optical pulse streams and provide the compliment coding on fiber optic conductors 36 to 40 at the light coupler 42. The time delayed multiplex optical pulse stream on fiber optic cable 17 is transmitted to the decoding logic 51 in the same manner as described hereinbefore with regard to FIGS. 1 to 4. The decoding logic 51 would be modified in this case to decode the complimented input and provide the same binary coded electrical signals on output lines 52.

Figure 6:
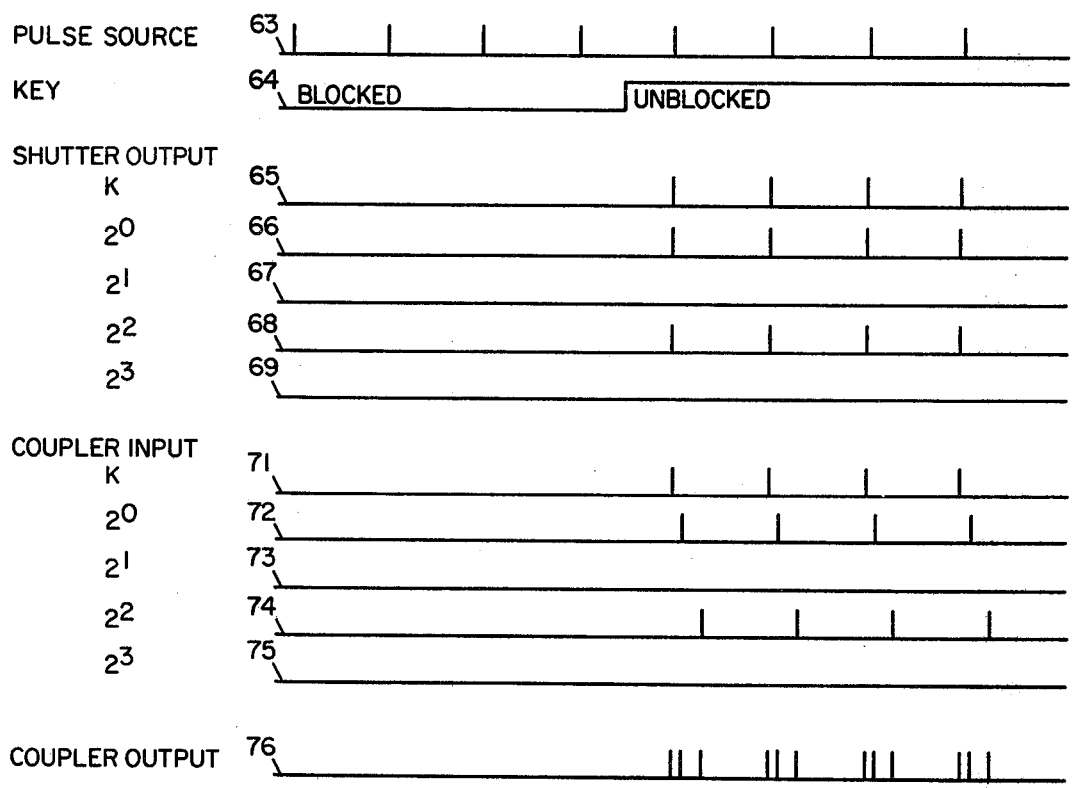
FIG. 6 is a timing diagram and waveforms produced when employing the shutters of FIG. 4.

Refer now to FIG. 6 showing timing pulses and waveforms associated with the shuttered embodiment shown in FIGS. 1 and 4. Pulse source 18 generates a continuous electrical pulse stream 63 on line 21. The LED 19 generates a substantially identical optical pulse stream on fiber optic cables 16 and 24 as a result of being electrically activated. Waveform 64 is a schematic representation showing the depression of one of the keys 53. During a blocked condition, (when no key is depressed), none of the optical pulse streams on conductors 24 are available as shutter outputs at collector lenses 31 to 35 and during the unblocked condition selected pulse streams being emitted at projectors 25 are capable of being received at collector lenses 31 to 35. In the example depicted, the five key has been depressed so that shutters 26, 28 and 30 are depressed by the actuating bar of the five key. Apertures 62 for the $2^0$ and $2^2$ shutters as well as the K shutter are moved vertically downward to permit the beam of light to be transmitted from projecting lenses 25 to collecting lenses 31, 33 and 35. It will be understood that self-focusing lenses and fiber optic cables are well known and commercially available and usually are placed very close to each other to avoid light dispersion. Thus, the drawings depicting the shutters are not shown to scale for purposes of illustration. The manner in which the shutters are mounted in the keyboard 10 is not important to the present invention. Such shutters may be pivotly mounted at one end or slideably mounted at both ends, but are spring biased to return to their normal position after being depressed.

Since shutters 27 to 29 are not depressed by the actuating bar of the five key, their shutter output remains blocked. It will be noted that waveforms 65, 66 and 68 at the output of shutters 26, 28 and 30 occur identically in time. Fiber conductor 40 contains no delay so that waveform 71 occurs at nearly the same time as waveforms 65, 66 and 68. The delay 43 shown in fiber optic conductor 36 inparts sufficient delay to the optical pulse stream 66 to displace it to the right relative to the non delayed optical pulse stream of waveforms 65, 66, 68 and 71. Whenever any key is depressed, pulse stream 71 will always be present. The delay 77 in conductor 38 is preferably three times as great as delay 43, thus, displacing waveform 74 even further to the right of waveforms 71 and 72. The optical pulse streams on conductors 36 to 40 are displaced in time one from the other so that when combined in light coupler 42 they will create a waveform on fiber optic cable 17 as shown by the waveform 76. The multiplexed and combined optical pulses of waveform 76 generate light pulses at point 47 which are sensed and converted into electrical pulses by photo diode 48. The electrical pulses, which are schematically identical to waveform 76, are amplified and then decoded by logic 51 to produce binary coded electrical signals on output lines 52 of the type employed in data processing equipment. It will be noted that the groups of output pulses of waveform 76 are separated by a time gap which will enable decode logic 51 to sense the start and finish of the data. In the preferred embodiment of decode logic 51, the non delayed pulse waveform 71 may be supplied by the K shutter 30 but may be also supplied directly from pulse source 18 to decode logic 51 and sensed as the start of data.

Delays 43, 77 and 78, 79 may be made by inserting a loop or coil of fiber optic conductor in the conducting paths 36 and 40 to provide delays of approximately 1.5 nanoseconds per foot of conductor inserted.

Figure 7:
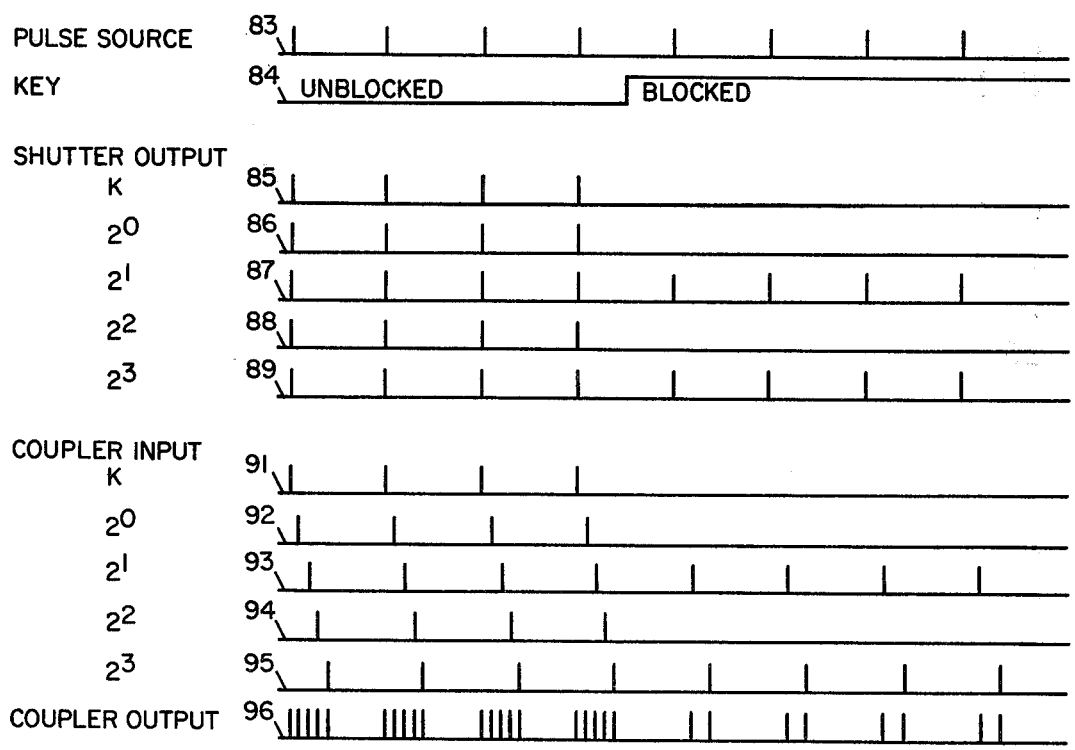
FIG. 7 is a timing diagram and waveform produced when employing the modified shutters of FIG. 5.

Refer now to FIG. 7 showing timing pulses and waveforms associated with the shutter embodiments shown in FIGS. 1 and 5. Pulse source waveform 83 is identical to pulse source waveform 63. Pulse source 18 generates the continuous electrical pulse stream 83 on line 21 and the LED 19 generates a substantially identical optical pulse stream on fiber optic cables 16 and 24 as described hereinbefore. Waveform 84 is a schematic presentation showing that during a blocked condition that some of the optical pulse streams at optical projecting lenses 25 are prevented from being transmitted to the collector lenses 31 to 35. However, during the unblocked condition, all of the optical pulse streams being presented at optical projector lenses 25 are being transmitted to the optical collector lenses 31 to 35. The waveforms 85 to 89 show, for example, that the K shutter blocks its optical pulse stream when the five key is depressed and that the $2^0$ and $2^2$ shutters also block their optical pulse streams when the five key is depressed. It will be recognized that the pulse stream being presented at the optical collectors 31 to 35 is the exact compliment of the pulse stream described with regard to FIG. 6. The pulse stream at collector lenses 31 to 35 is delayed by delays 43, and 77 to 79 as hereinbefore described. The pulse stream at collector lense 35 is not delayed and the pulse streams at collector lenses 31 to 34 are delayed by increasing amounts so as to displace the waveforms 92 through 95 from the base or non delayed waveform 91. The delayed signals reaching light coupler 42 initially include all five pulse waveforms, but when the five key is depressed, only the optical pulse streams being presented at the collector lense 31 and collector lense 33 are applied to light coupler 42. This generates the waveform shown as the light coupler waveform output 96. Waveform 96 is a combined and multiplexed light pulse waveform and is applied to fiber optic cable 17 to generate light pulses 47 which are detected by photo diode 48. The light pulse waveform 96 is substantially the same as the electrical pulse waveform which is amplified in amplifier 49 and decoded by decoder logic 51. In the present example of FIG. 7, it will be understood that the decode logic is not identical to the previously described decoding logic. In this case pulses from pulse source must be provided to decoding logic 51 to indicate the start of data. The decoding logic will provide binary coded electrical signals identical to those described hereinbefore with regard to FIG. 6.

Having explained a preferred embodiment of the present invention employing a schematic shutter representation for intercepting the optical pulse streams being projected from projecting lenses 25 to collector lenses 31 to 35, it will be understood that other forms of shutters and intercepting means may be employed to create a passive keyboard in which the electrical pulse source 12 and the decoding logic 14 may be placed completely remote from the passive keyboard 10.

For example, the delays 43 and 77 to 79 in conductors 36 to 40 could be placed on the transmitting side in conductors 24 without any modification of the FIG. 1 structure. Those skilled in the art of encoding and decoding will also recognize that the encoding bars and actuators could be incorporated into a single element, however, an X-Y array of projecting lenses and collecting lenses would be required to properly detect the key being depressed.

I claim:

1. An electrically inert keyboard apparatus, comprising:
a plurality of keys arranged in the form of a keyboard,
actuating bar means connected to each of said keys,
shutter means operated by said actuating bar means,
light pulse source means, fiber optic projection means coupled to said light pulse source means and arranged in parallel juxtaposed one side of said shutter means, fiber optic collector means arranged in parallel juxtaposed the other side of said shutter means for receiving said light pulses in parallel from said projection means, said collector means comprising a plurality of optical collectors each coupled to individual output fiber optic cables, coupling means for logic OR gating said individual output fiber optic cables into a single output fiber optic cable, delay means connected intermediate said light pulse source means and said coupling means in one of said fiber optic means, and decoding logic means coupled to said single output fiber optic cable for detecting the absence or presence of several light pulses at said optical collectors when said shutters are actuated by depression of a key of said keyboard and for producing electrical signals indicative of said key being depressed.

2. An electrically inert keyboard as set forth in claim 1 wherein said fiber optic projection means and said fiber optic collector means each comprise fiber optic cables and said delay means comprise a plurality of different lengths of fiber optic cables for delaying said light pulses being presented to said coupling means.

3. An electrically inert keyboard as set forth in claim 2 wherein said delay means comprising said different lengths of fiber optic cables are placed in series between said optical collectors and said coupling means.

4. An electrically inert keyboard as set forth in claim 1 wherein said actuating bar means comprises linear cross bars and said shutter means comprises a plurality of members having binary coded apertures therein.

5. An electrically inert keyboard as set forth in claim 1 wherein said actuating bar means comprises linear cross bars and said shutter means comprises a plurality of members having binary coded projecting shutters attached thereto.

6. An electrically inert keyboard as set forth in claim 1 wherein said actuating bar means comprises a linear cross bar connected to each key of said keyboard, and said shutter means comprises a plurality of decoding-encoding members selectively actuated by said linear cross bars, said decoding-encoding members having said shutter means thereon.

7. An electrically inert keyboard as set forth in claim 4 wherein each said decoding-encoding member is provided with a plurality of binary coded slots and projections adapted to cooperate with a first said linear cross bar, and a single shutter on each said decoding-encoding bar adapted to intercept one or more of said light pulses from said projection means.

8. An electrically inert keyboard as set forth in claim 1 wherein said light pulse source means is coupled to said fiber optic projection means by a plurality of input fiber optic cables, and said projection means further comprising a plurality of individual light projecting lenses having one lense for each input fiber optic cable.

9. An electrically inert keyboard as set forth in claim 8 wherein said light pulse source means is connected to a single input fiber optic cable, and light splitter means coupled to said single input fiber optic cable for providing a plurality of identical light pulse inputs connected to said plurality of input fiber optic cables.

10. An electrically inert keyboard as set forth in claim 1 wherein said decoding logic means is provided with means for sequentially detecting the absence or presence of light pulses in the form of a coded pulse train.

11. An electrically inert keyboard as set forth in claim 10 wherein said decoding logic means is coupled to said coded pulse train electrical signals indicative of one of said keys and provides a standard binary coded parallel signal output representation of the character represented by indicia on said key.

* * * * *